(12) United States Patent
Hwang et al.

(10) Patent No.: US 6,196,495 B1
(45) Date of Patent: *Mar. 6, 2001

(54) REEL FOR WINDING PHOTOSENSITIVE FILM

(75) Inventors: Jae-Young Hwang; Woo Choi, both of Kyongsangbuk-do; Byeong-Il Lee, Kyungki-do; Kie-Jin Park, Kyongsangbuk-do; Hyun-Seuk Choi, Kyonggsangbuk-do; Chang-Hoon Na, Kyongsangbuk-do, all of (KR)

(73) Assignee: Kolon Industries, Inc., Seoul (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/194,676
(22) PCT Filed: Mar. 28, 1997
(86) PCT No.: PCT/KR97/00051
  § 371 Date: Feb. 1, 1999
  § 102(e) Date: Feb. 1, 1999
(87) PCT Pub. No.: WO97/46070
  PCT Pub. Date: Dec. 4, 1997

(30) Foreign Application Priority Data

May 30, 1996 (KR) .................................................. 96-13935
May 30, 1996 (KR) .................................................. 96-13936
May 30, 1996 (KR) .................................................. 96-18824

(51) Int. Cl.$^7$ ................................................................ B65H 75/14
(52) U.S. Cl. ..................................... 242/608.2; 242/613.4; 242/614; 242/614.1
(58) Field of Search ............................... 242/608.2, 608.3, 242/608.4, 608.5, 608.6, 613.4, 614, 614.1, 610.6, 118.61, 118.62, 578, 578.3

(56) References Cited

U.S. PATENT DOCUMENTS 1,823,245 * 9/1931 Kraus et al. ....................... 242/608.6
3,088,689 * 5/1963 Perlini ............................... 242/608.3

(List continued on next page.)

FOREIGN PATENT DOCUMENTS 0-281292  9/1988  (EP) .
0-568062  11/1992 (EP) .
2-135653  9/1984  (GB) .

*Primary Examiner*—John M. Jillions
(74) *Attorney, Agent, or Firm*—Birch, Stewart, Kolasch & Birch, LLP

(57) ABSTRACT

Disclosed is a reel for winding photosensitive film (6) which stabilizes the winding shape of the film and minimizes the deformation of a photosensitive layer caused by the winding tension. The winding reel is easily carried and stored, and has a sufficient strength to stand against the winding tension of the wound photosensitive film. The user can check the amount of the wound photosensitive film. The winding reel has a cylindrical reel member (10) for winding the photosensitive film around a circumference thereof with a predetermined tension, and flange members (20, 30) detachably coupled to both sides of the reel member. The flange members (20, 30) have inner surfaces which are disposed in opposition to each other and are closed to both edges of the photosensitive film wound around the reel member. By the winding reel, it is possible to wind the photosensitive film around the reel member (10) with a proper tension. Since a width of the photosensitive film (6) is constantly maintained, the edge portion of the photosensitive film (6) is prevented from deforming. The reel member (10) is easily carried or stored. Since the flange members (20, 30) have plural windows (40, 42), it is possible to check the amount of the wound photosensitive film (6) with the naked eye, so it is very convenient to use the winding reel.

13 Claims, 8 Drawing Sheets

U.S. PATENT DOCUMENTS

| | | | |
|---|---|---|---|
| 3,342,435 | * 9/1967 | Gelardi et al. | 242/614 |
| 3,485,456 | * 12/1969 | Weyrich et al. | 242/608.4 |
| 4,088,278 | * 5/1978 | Adair | 242/608.8 |
| 4,101,095 | 7/1978 | Carter . | |
| 4,880,180 | * 11/1989 | Adair | 242/608.8 |
| 5,167,378 | 12/1992 | Johanson . | |
| 5,370,332 | * 12/1994 | Goff et al. | 242/608.8 |
| 5,474,254 | * 12/1995 | Faulkner | 242/614 |
| 5,676,332 | * 10/1997 | Kraus et al. | 242/608.6 |

* cited by examiner

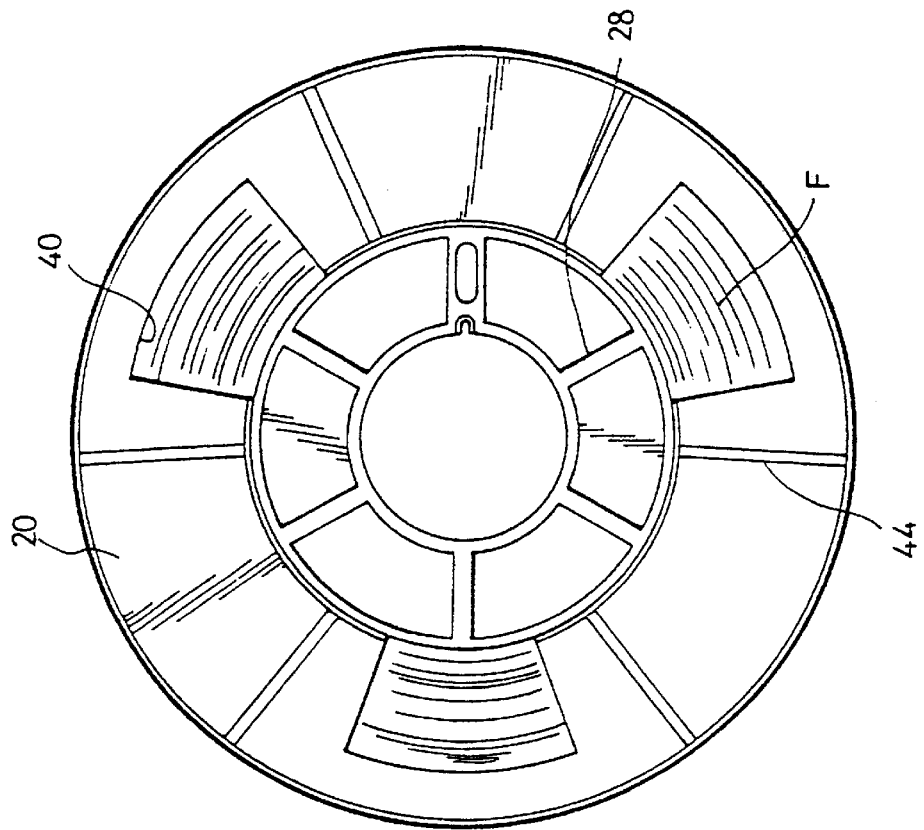
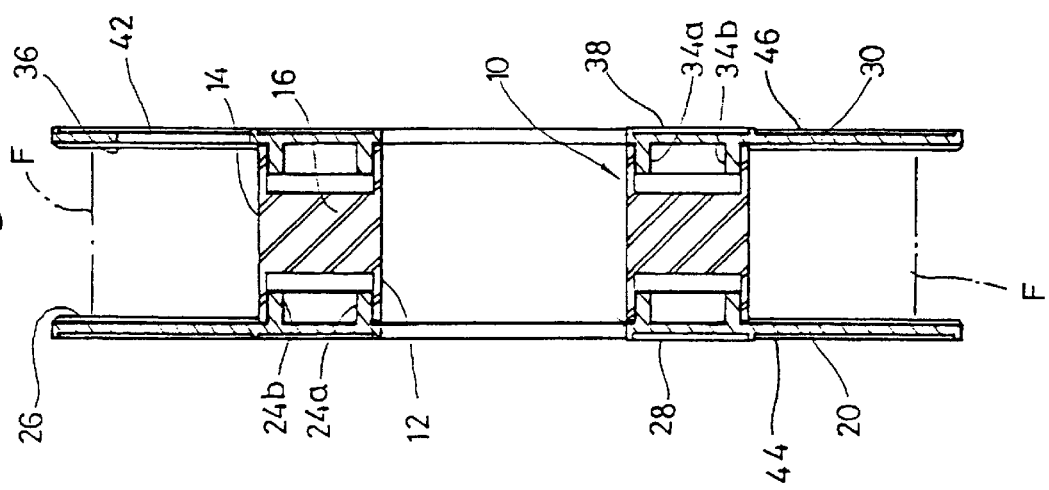

REEL FOR WINDING PHOTOSENSITIVE FILM

This application is the national phase under 35 U.S.C. §371 of prior PCT International Application No. PCT/KR97/00051 which has an International filing date of Mar. 28, 1997 which designated the United States of America, the entire contents of which are hereby incorporated by reference.

TECHNICAL FIELD

The present invention relates to a reel, and more particularly to a reel for winding photosensitive film, by which the photosensitive film having a predetermined width can be wound between flange members coupled to both sides of a reel member with a proper pressure, so that a large quantity of film may be wound around a circumference of the reel member.

BACKGROUND ART

Generally, photosensitive film used for making a printed circuit of a printed circuit board is manufactured through the steps of applying a photosensitive resin compound on a polyester film by a proper thickness, drying it at a predetermined temperature, and laminating a polyethylene film thereon. Here, the photosensitive resin composition comprises a polymeric binder as a binding carrier and a compound having at least one terminal ethylenically unsaturated group, i.e., a photopolymerizable monomer mixed with a photoinitiator and a solvent as main components.

An apparatus for manufacturing photosensitive film is shown in FIG. 1. As shown in FIG. 1, the apparatus comprises a photosensitive resin supplying section 1 which makes a photosensitive resin compound and supplies a proper amount of the photosensitive resin compound, a polyester film supplying section 2 for supplying a polyester film on which the photosensitive resin compound supplied from the photosensitive resin supplying section 1 is applied, a drying section 3 for drying the photosensitive resin compound applied on a base layer of a photosensitive film 6, a polyethylene film supplying section 4 which supplies a polyethylene film in such a manner that a surface layer of the photosensitive film 6 can be laminated on a photosensitive layer of the photosensitive film 6 which has been dried by the drying section 3, and a winding section 7 for winding the photosensitive film 6 having the base layer, the surface layer, and the photosensitive layer interposed therebetween.

The photosensitive film 6 that has been wound by the winding section 7 consists of the photosensitive layer 6a, the base layer 6b formed on one side of the photosensitive layer 6a, and the surface layer 6c formed on the other side of the photosensitive layer 6a. In addition, as shown in FIG. 2, the photosensitive film 6 which is cut in a predetermined width and length is wound around a cylindrical core 8.

The photosensitive film 6 is classified into an alkaline development type in which a non-exposed portion is removed by an alkaline aqueous, and a solvent development type in which a non-exposed portion is removed by an organic solvent. In the alkaline development type photosensitive film, a predetermined circuit pattern is obtained by the steps of separating the surface layer 6c from the photosensitive film 6, heating and pressing the photosensitive layer 6a in such a manner that the photosensitive layer 6a can make contact with the board while maintaining the base layer 6b to be coated on the photosensitive layer 6a, placing a mask film having a predetermined pattern on the base layer 6b, and exposing the photosensitive film 6 to ultraviolet rays.

However, the above mentioned photosensitive film 6, which is formed by stacking the photosensitive layer 6a, the base layer 6b and the surface layer 6c with each other, has a semi-solid state. Accordingly, if the photosensitive film 6 which is being wound around a core is subjected to a high tension, a pressure applied to the photosensitive layer 6a increases so that the photosensitive resin may be deformed. This kind of deformation may cause both edges of the wound photosensitive film 6 to be fused which is called "edge fusion phenomenon", thereby making the photosensitive film 6 non-available. On the contrary, if a low tension is applied to the photosensitive film 6 which is being wound around the core, some of the photosensitive film 6 that has been wound around the core deviates from its initial wound position, so the winding shape of the photosensitive film 6 is deformed which is called "telescope phenomenon", thereby resulting that the photosensitive film 6 is no more available to other processes in which the photosensitive film should be used.

In addition, in case that the size of the photosensitive film 6 is not suitable to the standard size (i.e., width of 300 to 500 mm, length of 100 to 200 mm), in other words, when the photosensitive film 6 has a width less than 300 mm and a length more than 300 m, the pressure applied to each layer of the photosensitive film wound around the cylindrical core is in inverse proportion to both a diameter and a width of each layer, and is in proportion to a winding tension of each layer, so the above mentioned "edge fusion phenomenon" or "telescope phenomenon" happens to be more extreme happened.

That is, as the length of the photosensitive film increases or as the width of the photosensitive film reduces, the higher tension should be applied to the photosensitive film to be wound in order to maintain the winding shape of the photosensitive film. However, if the tension applied to the photosensitive film becomes higher, the pressure applied to the photosensitive layer increases so that the semi-solid photosensitive resin may be more extremely deformed.

DISCLOSURE OF INVENTION

The present invention has been made to overcome the above described problems of the prior arts, and accordingly it is an object of the present invention to provide a reel for winding a photosensitive film, which not only stabilizes the winding shape of the photosensitive film, also minimizes the deformation of a photosensitive layer caused by a tension applied to the photosensitive film being wound, even when the photosensitive film having a narrow width and a long length is to be wound.

Another object of the present invention is to provide a reel for winding a photosensitive film, which can be easily handled when it is carried or stored.

Still another object of the present invention is to provide a reel for winding a photosensitive film, which has a sufficient strength to stand against a winding tension of the photosensitive film wound thereon, and in which an amount of the wound photosensitive film can be checked.

To achieve the above objects, the present invention provides a reel for winding a photosensitive film comprising a cylindrical reel member around which the photosensitive film is wound with a proper tension, and flange members which are detachably coupled to both sides of the reel member in such a manner that their inner surfaces, which are disposed in opposition to each other, are in close contact with to both edges of the wound photosensitive film.

The reel member includes a cylindrical inner reel and an outer reel which is fixed to an outer wall of the inner reel by a plurality of ribs in such a manner that the outer reel is spaced by a predetermined distance apart from the inner reel.

The flange members are formed at inner surfaces thereof with coupling protrusions which are inserted into ends of both the inner and outer reels, respectively.

In addition, the flange members are formed with windows so that the amount of the wound photosensitive film can be checked.

BRIEF DESCRIPTION OF DRAWINGS

The above object, and other features and advantages of the present invention will become more apparent by describing the preferred embodiment thereof with reference to the accompanying drawings, in which:

FIG. 8 is an assembling view of the winding reel shown in FIG. 7; and

FIG. 9 is a side view Of the winding reel shown in FIG. 8.

BEST MODE FOR CARRYING OUT THE INVENTION

Hereinafter, the present invention will be described in detail with reference to the accompanying drawings.

Figure 1:
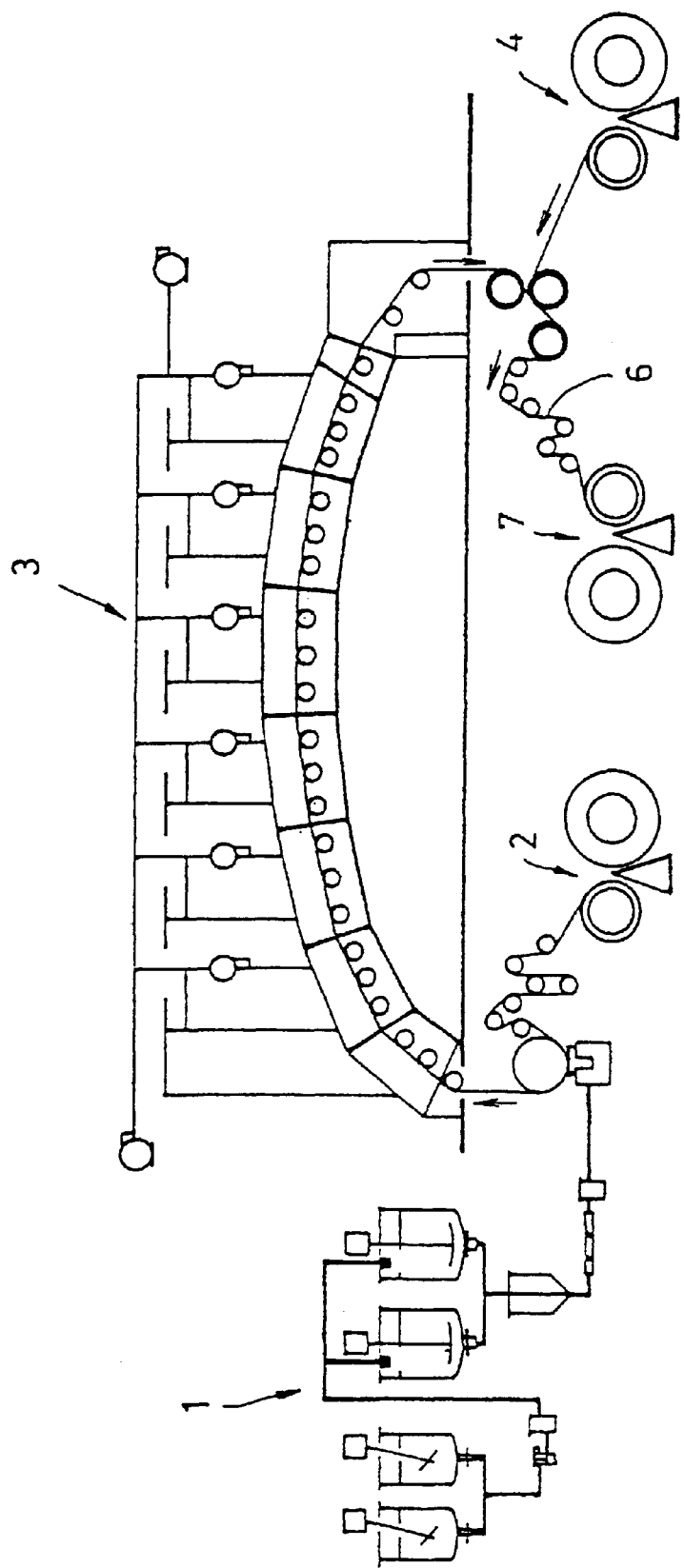
FIG. 1 is a schematic view showing an apparatus for manufacturing a photosensitive film.
Figure 2:
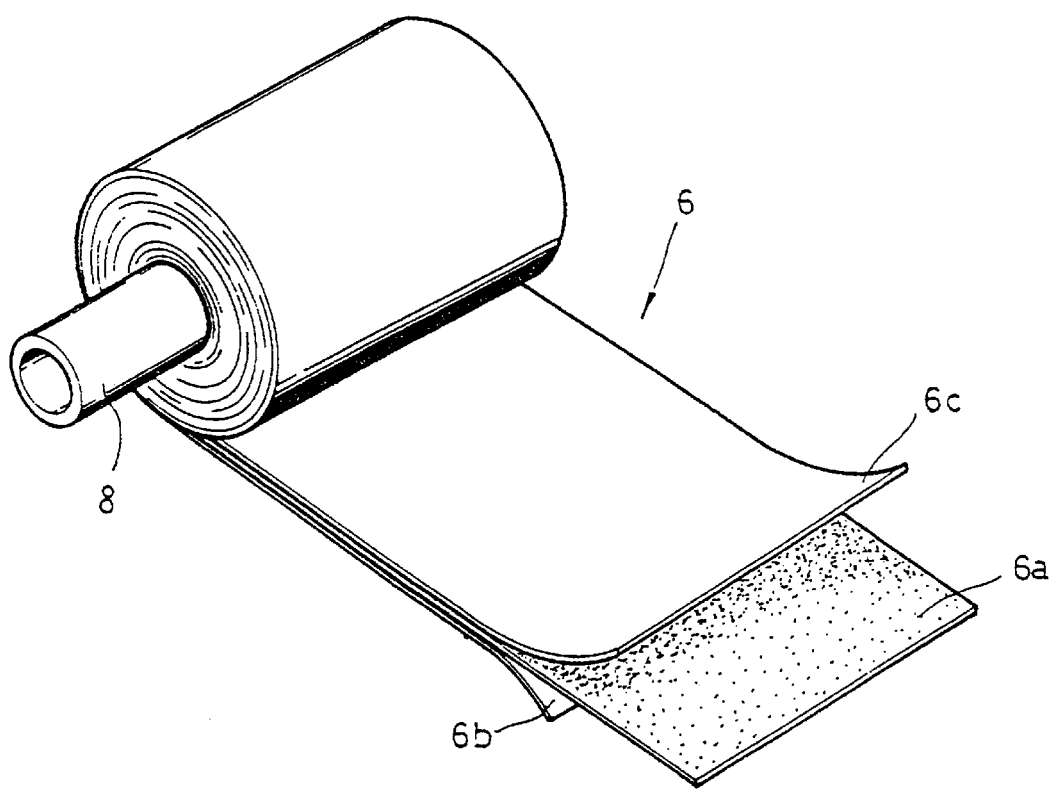
FIG. 2 is an exploded perspective view showing a winding shape of a conventional photosensitive film.
Figure 3:
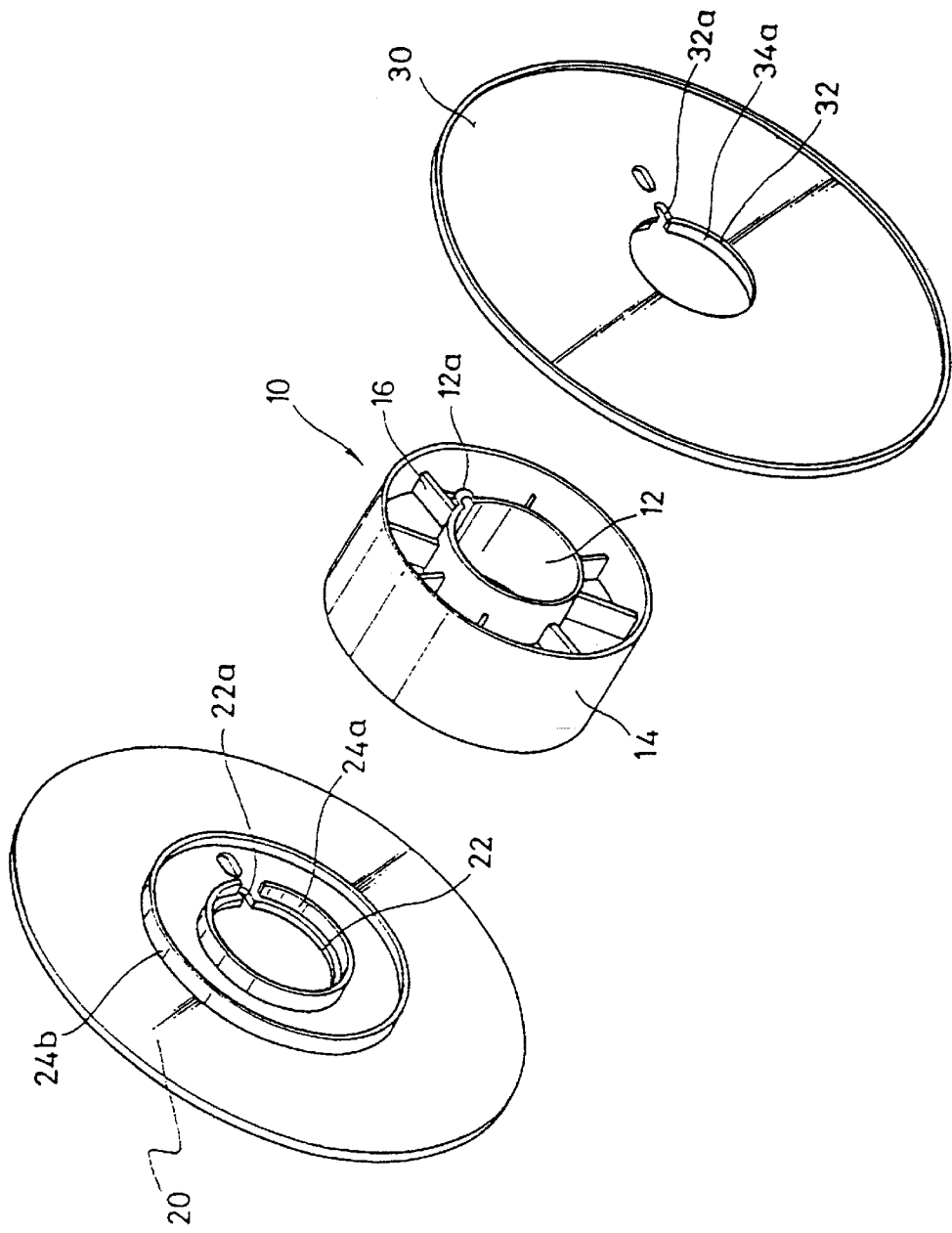
FIG. 3 is an exploded perspective view showing a reel for winding a photosensitive film according to a first embodiment of the present invention.
Figure 4:
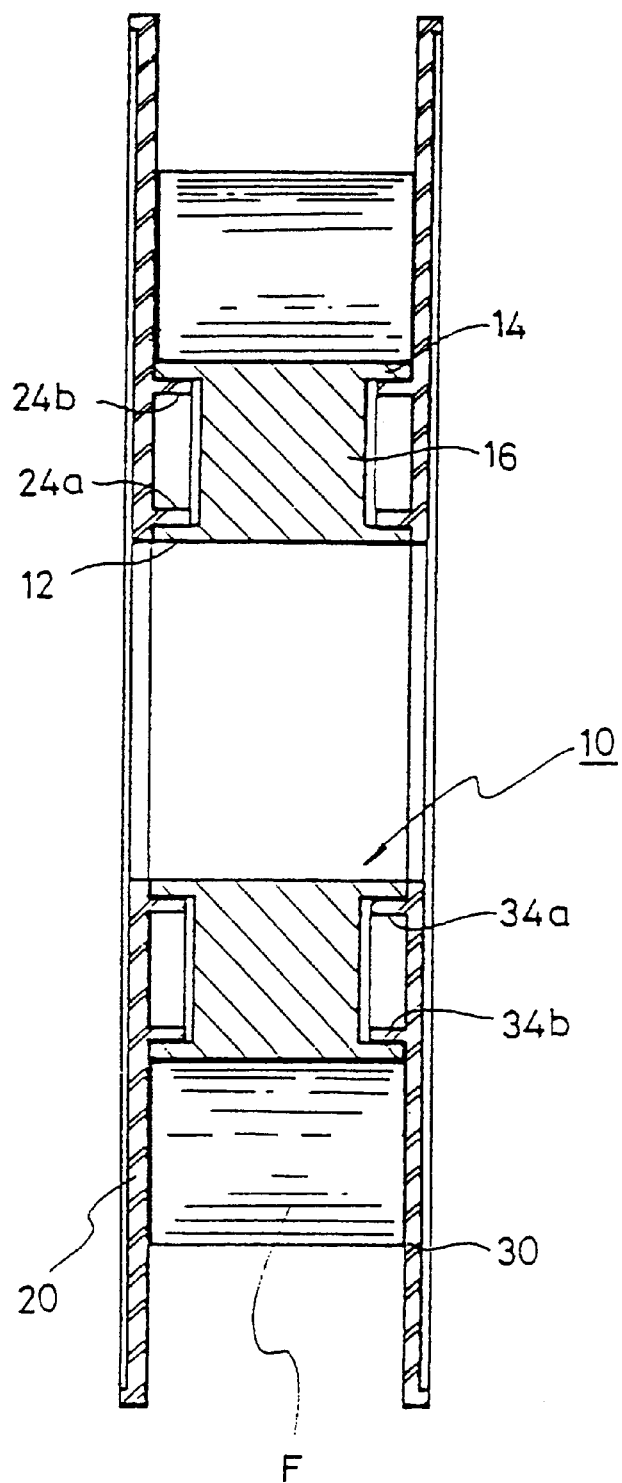
FIG. 4 is an assembling view of the winding reel shown in FIG. 3.

FIGS. 3 and 4 show the first embodiment of the present invention.

In the drawings, a reference number 10 indicates a reel member around which a photosensitive film F is wound. The reel member 10 includes a cylindrical inner reel 12 and an outer reel 14 which is spaced by a predetermined distance apart from an outer wall of the inner reel 12.

A plurality of ribs 16 radially extend between the outer wall of the inner reel 12 and inner wall of the outer reel 14. The inner reel 12 is formed with a fixing protuberance 12a protruded outward.

Preferably, a width of each ribs 16 is formed smaller than a width of the outer reel 14.

In addition, a pair of flange members 20 and 30, which are in close contact with both edges of the wound photosensitive film F so as to constantly maintain the width of the photosensitive film F, are coupled to both sides of the reel member 10 in opposition to each other.

Each of the flange members 20 and 30 is respectively formed at a center thereof with hollow portions 22 and 32 which are in correspondence to an inner circumference surface of the inner reel 12.

At an inner surface of each flange member 20 and 30, there are respectively provided first coupling protrusions 24a and 24b, and second coupling protrusions 34a, 34b. Both ends of the inner reel 12 are inserted into the coupling protrusions 24a and 34a, and the coupling protrusions 24b and 34b are inserted into the inner circumferences of the outer reel 14. Each of the hollow portions 22 and 32 is formed at a predetermined portion thereof with fixing holes 22a and 32a respectively, into which the fixing protuberance 12a is inserted, and thereby preventing the flange members 20 and 30 from rotating.

The reel member 10 and the flange members 20 and 30 can be manufactured of synthetic resins.

In addition, the width of the reel member 10 is adjustable according to the width of the photosensitive film F, and the diameters of the flange members 20 and 30 are also adjustable according to the quantity of the photosensitive film F to be wound.

In the winding reel having the above construction, the photosensitive film F having a predetermined width and length is wound around the outer circumference of the reel member 10.

At this time, it is possible to wind a photosensitive film having a width less than 300 mm and a length more than 300 m around the outer circumference of the reel member 10. Of course, a photosensitive film having a width more than 300 mm and a length of 100 to 200 m can be easily wound on the reel member 10.

When the photosensitive film F having a predetermined length has been wound around the outer circumference of the reel member 10, the flange members 20 and 30 are coupled to both sides of the reel member 10.

That is, if the user compulsorily inserts the coupling protrusions 24a, 24b, 34a, and 34b formed on the inner surfaces of the flange members 20 and 30 into the inner reel 12 and the outer reel 14, the flange members 20 and 30 are maintained in a fixing state. In this state, if the user fits the fixing protuberance 12a of the inner reel 12 with fixing holes 22a and 23a formed in the hollow portions 22 and 32 of the flange members 20 and 30, the flange members 20 and 30 are securely coupled to both sides of the reel member 10.

The inner surfaces of the flange members 20 and 30, which are securely coupled to both sides of the reel member 10 in opposition to each other, are in close-contact with both edges of the photosensitive film F wound around the reel member 10 so that the width of the photosensitive film F may be constantly maintained, and thereby increasing the amount of the photosensitive film F to be wound.

Since the width of the photosensitive film F is constantly maintained by the flange members 20 and 30, the deformation of the photosensitive film F or the edge fusion phenomenon caused by the winding tension applied to the photosensitive film F can be prevented.

Figure 5:
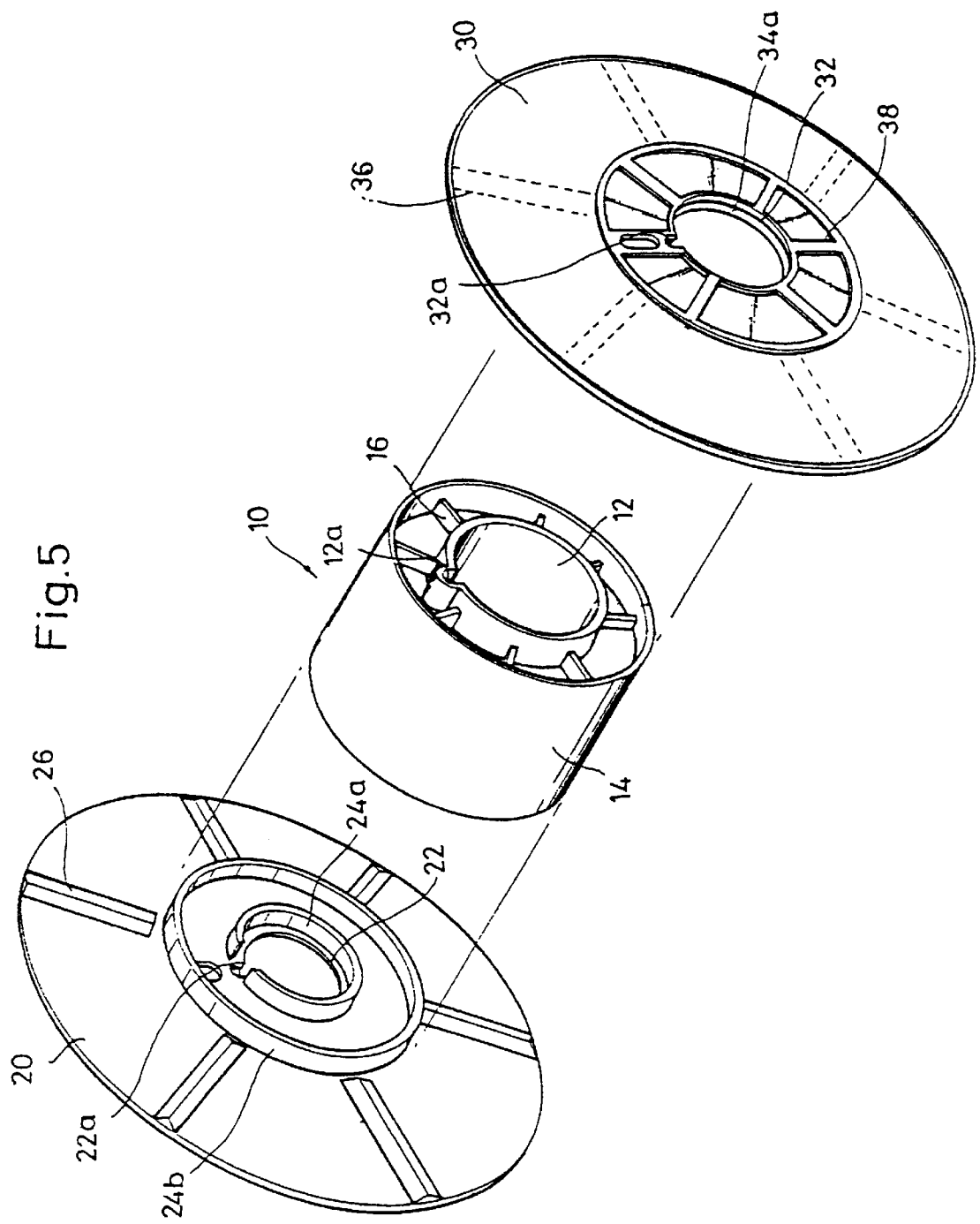
FIG. 5 is an exploded perspective view showing a reel for winding a photosensitive film according to a second embodiment of the present invention
Figure 6:
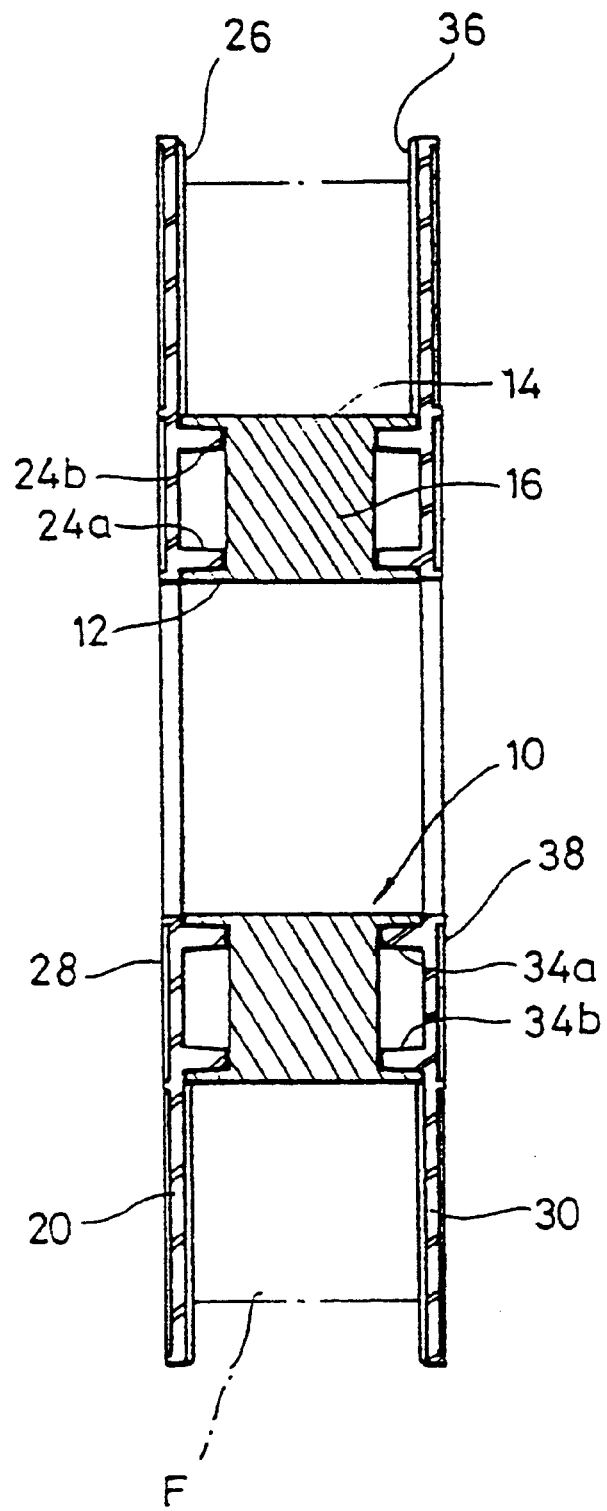
FIG. 6 is an assembling view of the winding reel shown in FIG. 5.

FIGS. 5 and 6 show the second embodiment of the present invention. In this embodiment, the construction of a reel member is the same as the reel member 10 of the first embodiment, and flange members 20 and 30 coupled to both sides of the reel member are formed at their inner surfaces with a plurality of contacting ribs 26 and 36 which are radially protruded in such a manner that they make close-contact with both edges of the wound photosensitive film F.

The contacting ribs 26 and 36 not only make close contact with both edges of the wound photosensitive film F, but also prevent the flange members 20 and 30 from deforming.

In addition, the flange members 20 and 30 are formed at their outer surfaces with a plurality of supporting ribs 28 and 38 which are radially protruded and are respectively positioned between coupling protrusions 24a and 24b, and between coupling protrusions 34a and 34b which are formed at the inner surfaces of the flange members 20 and 30.

According to this embodiment, the outer surfaces of the contacting ribs 26 and 36, which are formed in the inner surfaces of the flange members 20 and 30, make close contact with both edges of the photosensitive film F wound around the outer circumference of the photosensitive film F, so the width of the photosensitive film F is constantly maintained, and thereby resulting a stable winding shape of the photosensitive film F.

In addition, since the plural supporting ribs 28 and 38 are provided on the outer surfaces of the flange member 20 and 30, the photosensitive film F can stand against th-pressure applied thereto, so the deformation of the photosensitive film F can be prevented.

Figure 7:
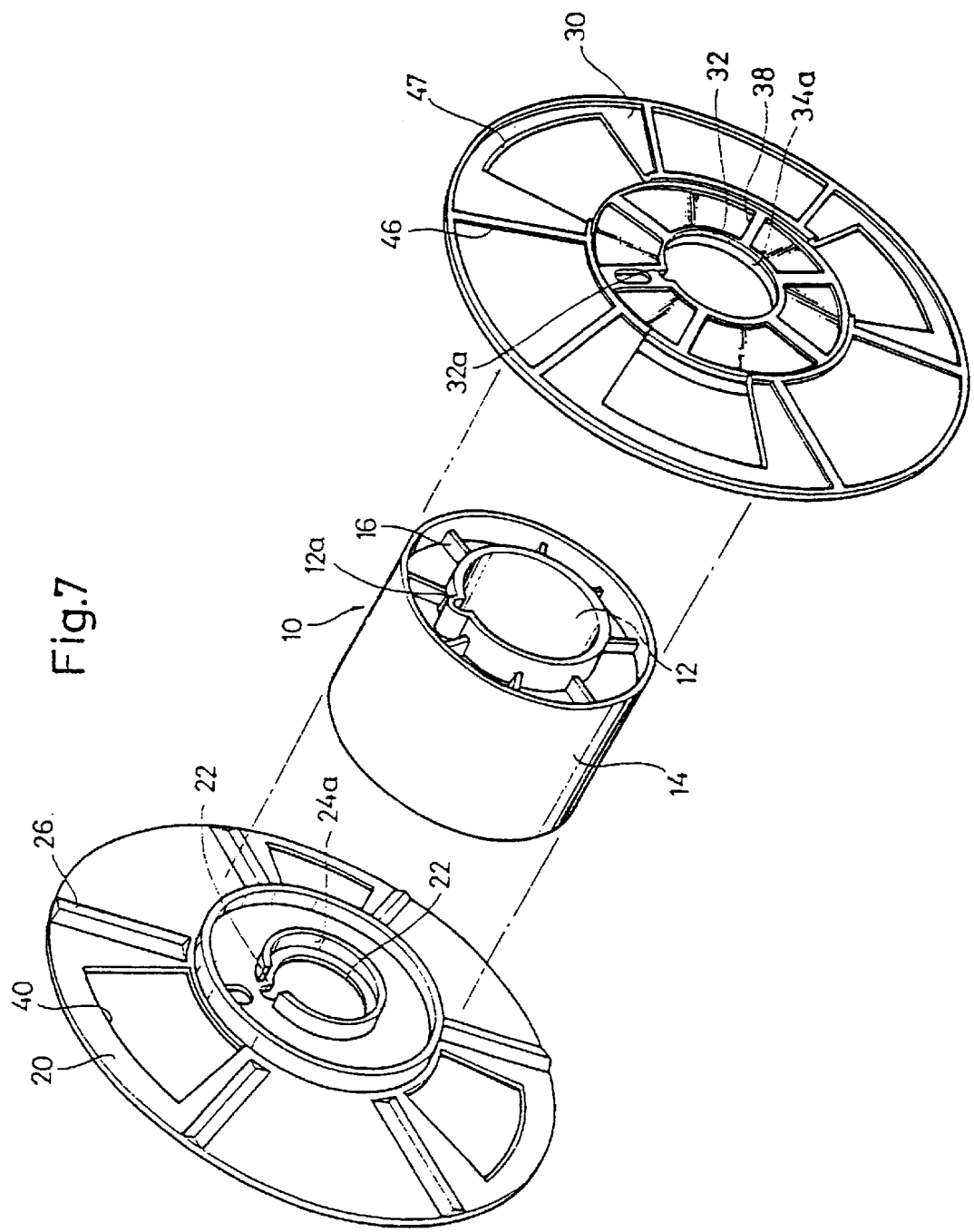
FIG. 7 is an exploded perspective view showing a reel for winding a photosensitive film according to a third embodiment of the present invention.

FIGS. 7 to 9 show the third embodiment of the present invention. In this embodiment, the construction of a reel member is the same as the reel member 10 of the first embodiment, and flange members 20 and 30 coupled to both sides of the reel member are formed with a plurality of windows 40 and 42 which are formed between contacting ribs 26 and 36, such that not only can the amount of the wound photosensitive film F be checked, but also a volatile material generated from the photosensitive film F can be dispersed into the atmosphere.

In addition, the flange members 20 and 30 are formed at their outer surfaces with a plurality of protruded supporting ribs 28, 38, 44 and 46. Preferably, the supporting ribs 44 and 46 are formed at rear sides of the contacting ribs 26 and 36.

The windows 40 and 42, by which the user sees the amount of the wound photosensitive film F with the naked eye, can be formed by cutting the flange members 20 and 30. In addition, it is also possible to attach a transparent glass or acrylic resin within the windows 40 and 42.

According to this embodiment, the plural supporting ribs 28, 38, 44 and 46 are protruded on the outer surfaces of the flange member 20 and 30, so the deformation of the photosensitive film F caused by the pressure applied thereto can be prevented. Particularly, since the plural windows 40 and 42 are formed in the flange members 20 and 30, the user can check the amount of the wound photosensitive film F with the naked eye so that it is very convenient to use the winding reel.

As described above, according to the present invention, the photosensitive film having a proper width and length is wound around the circumference of the reel member, and a pair of flange members having a plurality of contacting ribs, which are in close-contact with both edges of the wound photosensitive film, are coupled to both sides of the reel member, so it is possible to wind the photosensitive film around the reel member with a proper tension. In addition, since the width of the photosensitive film is constantly maintained by the flange members, the edge portion of the photosensitive film can be prevented from deforming. Further, it is easy to carry or store the reel member.

Furthermore, since the flange members have plural windows, it is possible to check the amount of the wound photosensitive film with the naked eye, and accordingly, it is very convenient to use the winding reel. In addition, the reel and flange can be re-used.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A reel for winding a photosensitive film, the winding reel comprising:

a cylindrical reel member for winding the photosensitive film, which possesses a width of less than 300 mm, wherein the photosensitive film can be wound around a circumference of the reel member with a predetermined tension, the reel member including a cylindrical inner reel and an outer reel that is spaced apart from the inner reel by a predetermined distance, the outer reel being fixed to an outer wall of the inner reel by a plurality of ribs, spaced inward of the sides of the inner and outer reel members, and the inner reel being formed at a predetermined position thereof with a fixing protuberance; and a pair of flange members detachably coupled to both sides of the reel member, the pair of flange members having inner surfaces which are disposed in opposition to each other and being formed at the inner surface thereof with a plurality of protruded contacting ribs, the inner surfaces thereby being in close contact to both edges of the photosensitive film when the same is wound around the reel member, the flange members being formed at the inner surface thereof with fixing holes into which the fixing protuberance is inserted.

2. The winding reel as claimed in claim 1, wherein the ribs radially extend from the outer wall of the inner reel to the inner wall of the outer reel.

3. The winding reel as claimed in claim 1, wherein each of the flange members includes coupling protrusions which are formed at centers of the flange members and which are inserted into ends of both the inner and outer reels, respectively.

4. The winding reel as claimed in claim 1, wherein each of the flange members is formed at an outer surface thereof with a plurality of protruded supporting ribs.

5. The winding reel as claimed in claim 1, wherein each of the flange members has at least one window for checking an amount of the photosensitive film wound around the reel member.

6. The winding reel as claimed in claim 5, wherein each of the flange members has a plurality of windows which are equi-distantly apart from each other.

7. The winding reel as claimed in claim 5, wherein a transparent material is attached within the window.

8. The winding reel as claimed in claim 7, wherein the transparent material includes a glass.

9. The winding reel as claimed in claim 7, wherein the transparent material includes an acrylic resin.

10. A method of winding a photosensitive film having a width of less than 300 mm, the method comprising the steps of:

providing a winding reel containing a cylindrical reel member for winding the photosensitive film, which possesses a width of less than 300 mm, wherein the photosensitive film can be wound around a circumference of the reel member with a predetermined tension, the reel member including a cylindrical inner reel and an outer reel that is spaced apart from the inner reel by a predetermined distance, the outer reel being fixed to an outer wall of the inner reel by a plurality of ribs, spaced inward of the sides of the inner and outer reel members, and the inner reel being formed at a predetermined position thereof with a fixing protuberance, and a pair of flange members detachably coupled to both sides of the reel member, the pair of flange members having inner surfaces which are disposed in opposition to each other and being formed at the inner surface thereof with a plurality of protruded contacting ribs, the inner surfaces thereby being in close contact to both edges of the photosensitive film when the same is wound around the reel member, the flange members being formed at the inner surface thereof with fixing holes into which the fixing protuberance is inserted; and winding the photosensitive film on said winding reel.

11. The method of claim 10, wherein the photosensitive film contains a photosensitive layer in a semi-solid state.

12. The method of claim 10, wherein the photosensitive film has a length of more than 300 m.

13. The method of claim 12, wherein the photosensitive film contains a photosensitive layer in a semi-solid state.

* * * * *